(12) United States Patent
Karnik et al.

(10) Patent No.: US 6,552,887 B1
(45) Date of Patent: Apr. 22, 2003

(54) VOLTAGE DEPENDENT CAPACITOR CONFIGURATION FOR HIGHER SOFT ERROR RATE TOLERANCE

(75) Inventors: Tanay Karnik, Portland, OR (US); Rajendran Nair, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 267 days.

(21) Appl. No.: 09/608,457

(22) Filed: Jun. 29, 2000

(51) Int. Cl.[7] ............................ G11C 11/40; G11C 13/00
(52) U.S. Cl. ........................... 361/56; 365/149; 365/184
(58) Field of Search ........................... 361/56; 365/149, 365/184, 189.01, 226

(56) References Cited

U.S. PATENT DOCUMENTS

| | | | | |
|---|---|---|---|---|
| 4,725,875 A | * | 2/1988 | Hsueh | 257/350 |
| 4,799,093 A | * | 1/1989 | Kohara et al. | 257/297 |
| 4,839,865 A | * | 6/1989 | Sato et al. | 365/189.09 |
| 4,991,137 A | * | 2/1991 | Matsumoto | 365/149 |
| 5,148,392 A | * | 9/1992 | Matsumoto | 365/149 |
| 5,303,190 A | * | 4/1994 | Pelley, III | 327/509 |
| 5,324,961 A | * | 6/1994 | Rodder | 257/306 |
| 5,726,944 A | * | 3/1998 | Pelley et al. | 365/189.01 |

* cited by examiner

Primary Examiner—Bao Q. Vu

(74) Attorney, Agent, or Firm—Blakely, Sokoloff, Taylor & Zafman LLP

(57) ABSTRACT

A voltage dependent capacitor to provide soft error rate tolerance in an integrated circuit is disclosed. In one embodiment, a parallel n-p voltage dependent capacitor is used to protect a node from noise. In another embodiment, an nFET-in-nWell voltage dependent capacitor is used to provide a soft error rate tolerant capacitor with reduced area.

25 Claims, 5 Drawing Sheets

VOLTAGE DEPENDENT CAPACITOR CONFIGURATION FOR HIGHER SOFT ERROR RATE TOLERANCE

FIELD OF INVENTION

The invention relates generally to integrated circuits. In particular, the invention relates to reducing soft errors in integrated circuits.

BACKGROUND OF THE INVENTION

The operating voltage of a high-speed microprocessor is being reduced as process technology scales. For example, microprocessor device dimensions are shrinking and integrated circuit (IC) chips are operating at increasing frequencies. As a result, IC chips are becoming more susceptible to external interferences. Interference may be caused by cosmic rays, or by spurious noise, for example.

These noise sources can cause soft errors in memories and storage elements in the IC chips when they are used at high altitudes in aerospace applications. Also, the noise sources can cause soft errors in IC chips even at ground levels. A conventional capacitor does not adjust itself to fight a node charge injection by noise sources. Consequently, storage elements in data paths of an IC chip, such as static latches and dynamic gates for example, are becoming susceptible to the soft error rate (SER) caused by noise sources.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A voltage dependent capacitor to provide higher soft error rate (SER) tolerance is disclosed. The capacitor has a capacitance that changes in response to noise. In one embodiment, the capacitor includes a pMOS (p metal oxide semiconductor) capacitor connected in parallel to an nMOS (n metal oxide semiconductor) capacitor. In another embodiment, the capacitor includes an nFET(n Field Effect Transistor)-in-nWell device.

The voltage dependent capacitor achieves a higher soft error rate tolerance by adding an explicit capacitance on a susceptible storage node. The voltage dependent capacitor can have a high capacitance to area ratio, so that the node is able to hold both '0' and '1' states on the node in case of external interference, such as a cosmic ray, for example. The capacitor also enables the node to efficiently hold a state in case of spurious noise attacks. The voltage dependent capacitor thus hardens the storage nodes from external interference, which increases the SER tolerance of the nodes. The voltage dependent capacitor further requires less area on an IC chip than conventional capacitors.

Figure 1:
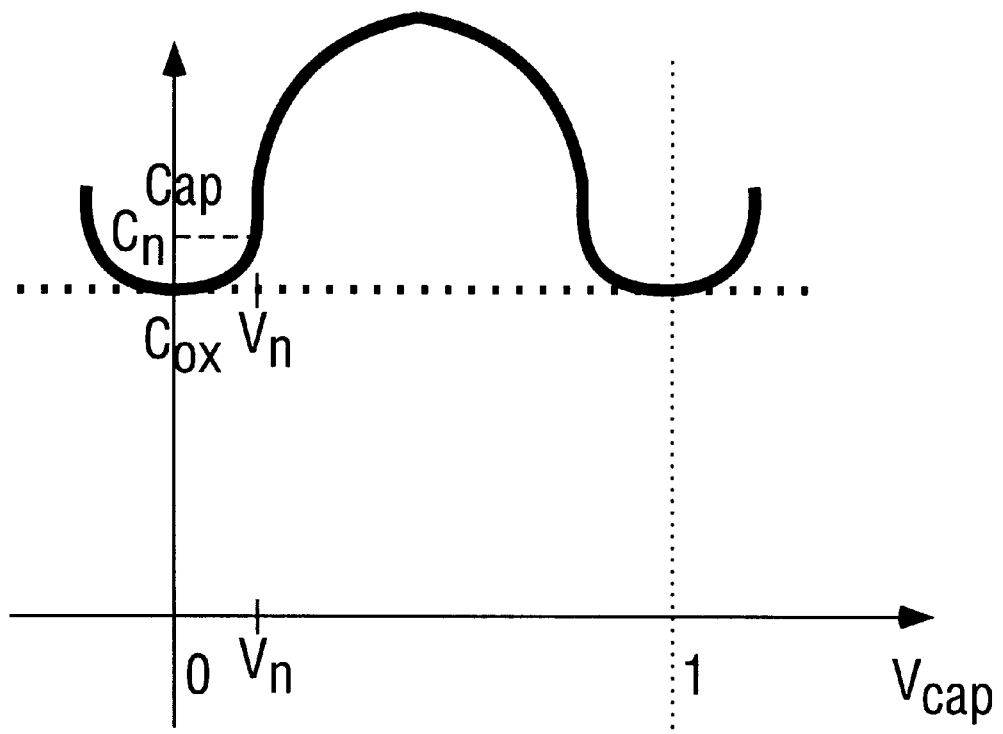
FIG. 1 is an ideal capacitance-to-voltage (CV) curve to hold both '0' and '1' states.

A capacitance structure that exhibits voltage dependency is significantly better in its ability to hold a node at a given voltage value. A capacitor that is able to hold both '0' and '1' states in spite of noise can have an ideal voltage-dependent capacitance as shown in FIG. 1. A capacitor having this capacitance-to-voltage (CV) curve holds both '0' and '1' states well. If noise is injected into the capacitor, the change in voltage across the capacitor will automatically increase the capacitance value, which prevents noise from changing the state of the capacitor.

For example, suppose the capacitor is in the '0' state having voltage $V_0$ and capacitance $C_{OX}$. If an external noise $V_n$ is injected into the capacitor, the capacitance increases to $C_n$. This external noise is not sufficient to change the value of the capacitor from the '0' state to the '1' state. The capacitor returns to $C_{OX}$ and maintains the '0' state, thus successfully fighting the noise injection. However, a capacitor having an ideal capacitance to voltage curve may consume a significant amount of area on an IC.

Figure 2:
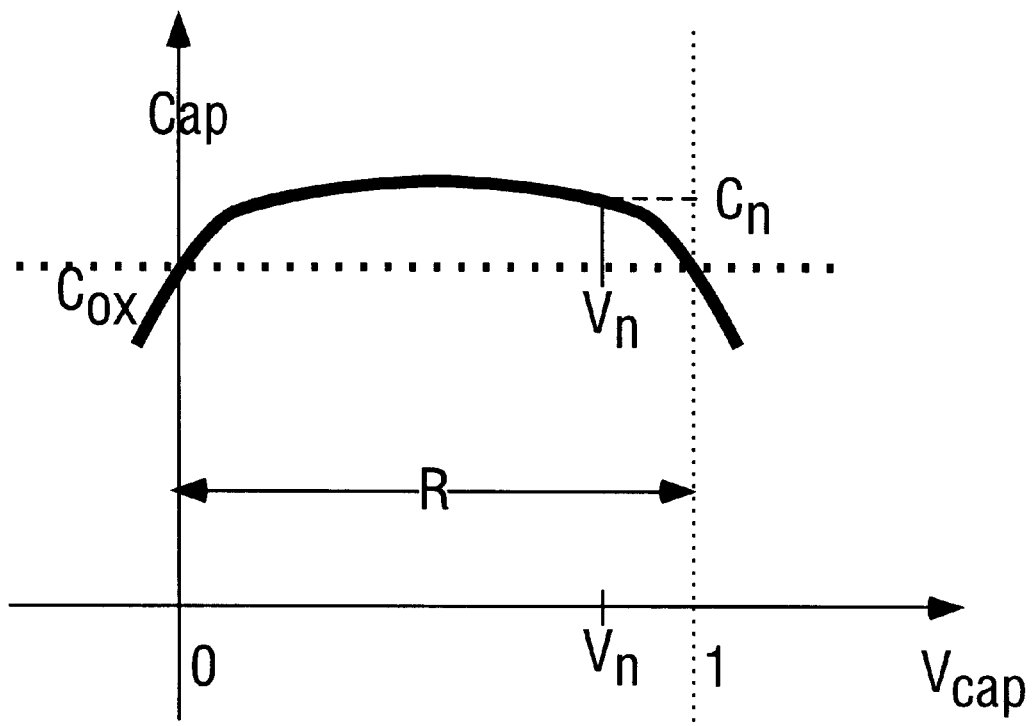
FIG. 2 is a practical CV curve to hold both '0' and '1' states.

A practical capacitance-to-voltage (CV) curve is shown in FIG. 2. A capacitor having this CV curve increases its capacitance value when the noise injection is in the unwanted range, which is the-range R between the '0' state and the '1' state, as shown in FIG. 2. For example, if the capacitor is in the '1' state, and the noise injection is $V_n$, the capacitance increases from $C_{OX}$ to $C_n$, thus enabling the capacitor to resist the noise injection and maintain the '1' state.

This CV curve is not ideal, because outside of the unwanted range R, the capacitance decreases as voltage increases. However, the noise that is outside of the unwanted range does not change the state of the capacitor. Therefore, a capacitor having a CV curve as shown in FIG. 2 can occupy less area on an IC than a capacitor having an ideal CV curve of FIG. 1.

Figure 3:
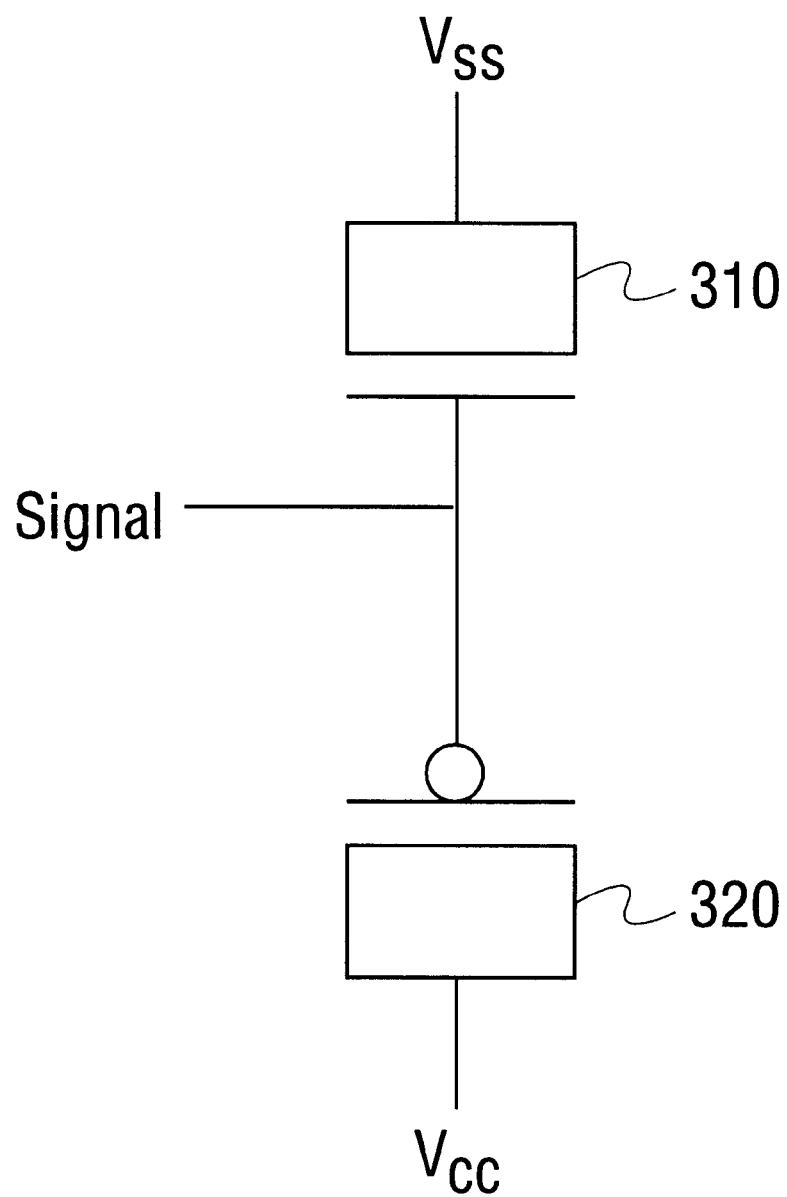
FIG. 3 is an embodiment of an SER tolerant capacitor.

One embodiment of a voltage dependent capacitor that approximates the practical CV curve of FIG. 2 to provide soft error rate (SER) tolerance is shown in FIG. 3. Two capacitors, such as an nMOS capacitor 310 and a pMOS capacitor 320, for example, are connected in parallel.

Figure 4:
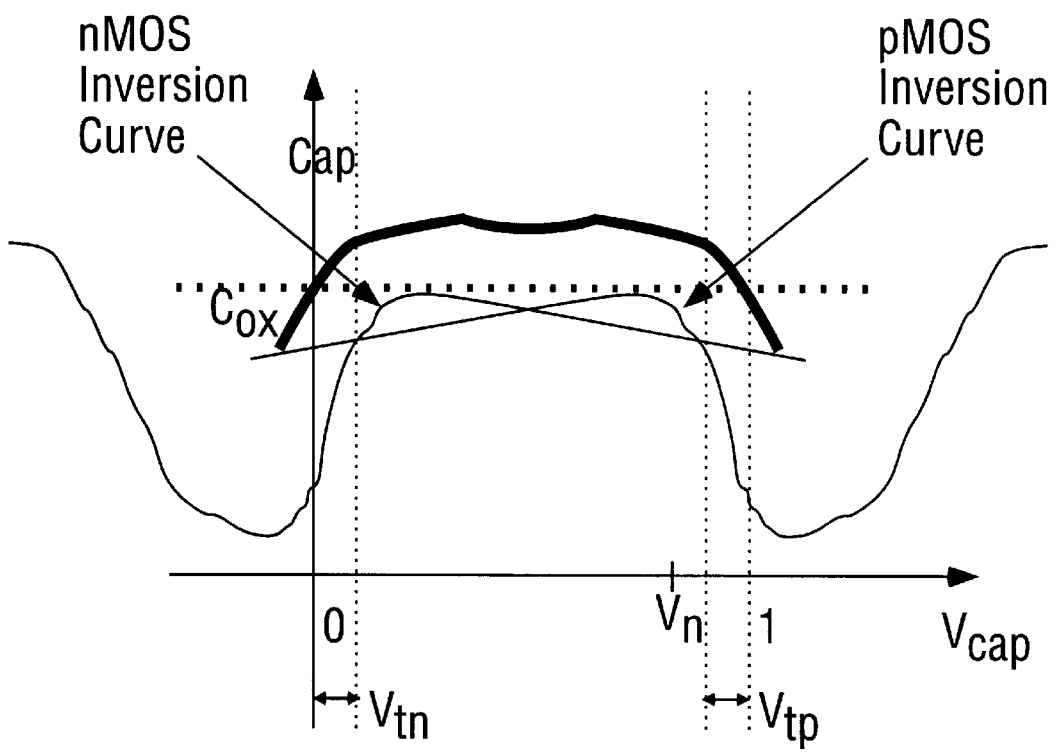
FIG. 4 is a CV Curve of the capacitor shown in FIG. 3.

In the embodiment shown in FIG. 3, the depletion-inversion sloping curves of the nMOS and pMOS devices can be shifted towards '0' (for the nMOS device, for example) and '1' (for the pMOS device, for example), as shown in FIG. 4, to achieve a CV curve that enables the voltage dependent capacitor to resist noise and maintain its current state. ($V_{tn}$ is the threshold voltage of the nMOS device and $V_{tp}$ is the threshold voltage of the pMOS device). Because both of the capacitors are in depletion-inversion, as shown in FIG. 4, source and drain diffusions are required. The voltage dependent capacitor of FIG. 3 yields high capacitance for its entire range of operation, which results in a higher effective capacitance per area.

Figure 5:
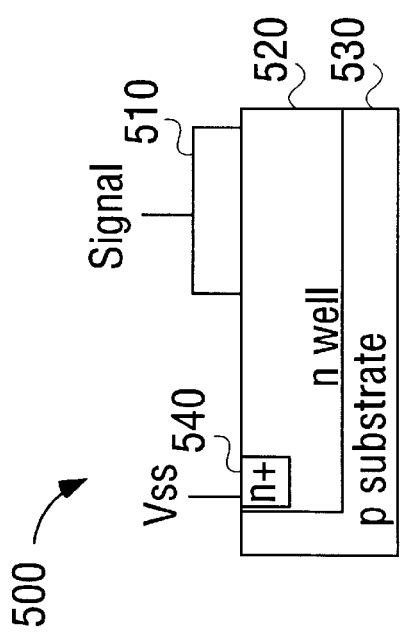
FIG. 5 is an embodiment of a low area SER tolerant capacitor.

The voltage dependent capacitor shown in FIG. 3 provides a practical voltage dependent, SER hardening capacitor. However, a node in a circuit that needs to be held at '0' as well as '1' could use an alternate voltage dependent capacitor as shown in FIG. 5, that requires less area than the embodiment of FIG. 3. The '0' state may be approximately 0 volts, and the '1' may be approximately 1 volt, for example.

FIG. 5 shows an embodiment of a voltage dependent capacitor having an nFET-in-nWell device 500. An n-well 520 is placed on a p-substrate 530. A signal is input to the device 500 through an n-type polysilicon gate input 510. An internal implicit n-well resistance R1 connects gate 510 to n+ well tap 540 through the n-well 520.

The n-doped source and drain diffusions are eliminated without significant loss in capacitive performance. This reduces the amount of area of the capacitor and increases the SER tolerance of the corresponding node. Thus, this embodiment of a voltage dependent capacitor can be used to provide an area efficient SER hardening device.

Figure 6:
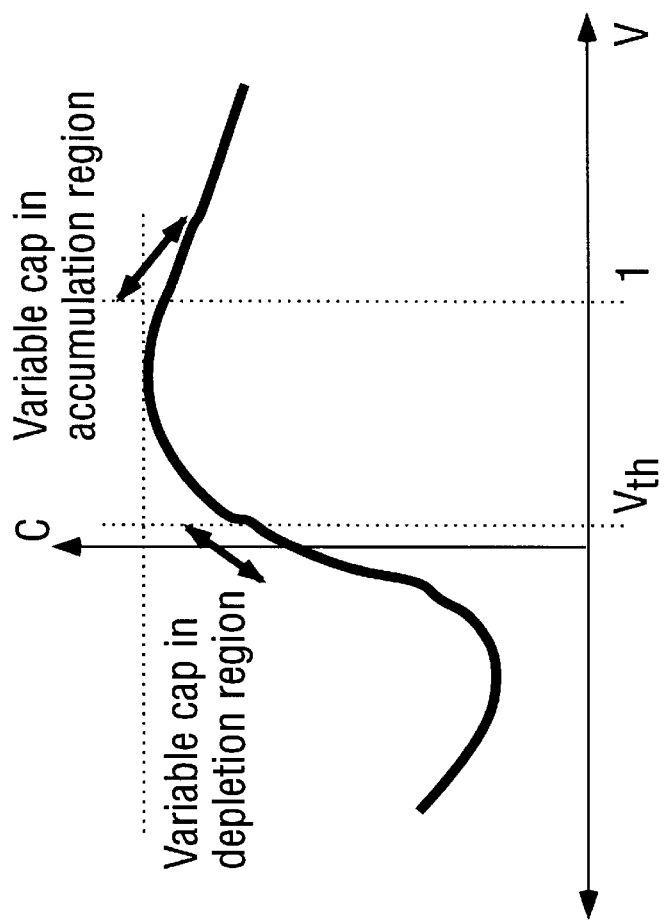
FIG. 6 is a CV Curve of the capacitor shown in FIG. 5.

An example of an ideal capacitance-voltage curve for the voltage dependent capacitor of FIG. 5 is shown FIG. 6. This alternative embodiment displays a positive voltage dependency at the '0' state, as shown in FIG. 6. In this embodiment, the capacitor has a weak negative dependency at the '1' state.

Furthermore, as shown in FIG. 5, the resistance R1 can be adjusted by changing the position of the n+ well tap connected to Vss. This changes the internal inherent resistance of the capacitor device. The resistance adjustment can be utilized in frequency response tuning.

This embodiment provides several significant features. The voltage dependence of this capacitor yields higher holding capacity, and the lack of diffusions saves area as well as reduces SER collection area. The adjustable internal resistance enables frequency tuning. Furthermore, this capacitor provides an excellent node capacitance for high soft error tolerance.

Thus, several embodiments of a voltage dependent capacitor to provide soft error rate tolerance are disclosed. In one embodiment, a parallel n-p voltage dependent capacitor is used to protect a node from noise if area is not a significant concern. Alternatively, an nFET-in-nWell voltage dependent capacitor is used if reducing the area of the capacitor is important.

The voltage dependent capacitor has an appropriate voltage dependency, positive in the case of a '0' state and negative in the case of a '1' state, to provide a node capacitance for high soft error tolerance. This voltage dependent capacitor thus enables the speed of microprocessors to be increased. Furthermore, the voltage dependent capacitor directly supports 30% supply voltage scaling and development of process technologies for low voltage, high performance and low power CMOS (complimentary metal oxide semiconductor) circuits. Latched circuits can be introduced into integrated circuits without being adversely affected by soft error rates by using voltage dependent capacitors. The fabrication of the voltage dependent capacitors disclosed herein is compatible with current processing technology.

These and other embodiments of the present invention may be realized in accordance with the teachings described herein and it should be evident that various modifications and changes may be made to these teachings without departing from the broader spirit and scope of the invention. The specification and drawings are, accordingly, to be regarded in an illustrative rather than restrictive sense and the invention measured only in terms of the claims.

What is claimed is:

1. An apparatus comprising:
   an integrated circuit node to conduct a signal; and
   an explicit capacitor that is compatible with fabrication steps used to build a MOS integrated circuit device, coupled to the node and having a capacitance that changes in response to noise to increase a soft error rate tolerance of the node.

2. The apparatus of claim 1, wherein the capacitor comprises:
   a pMOS explicit capacitor connected to increase a capacitance of the node; and
   an nMOS explicit capacitor connected to increase a capacitance of the node.

3. The apparatus of claim 1 wherein the capacitance increases in response to noise that causes the signal to change in a direction of another state.

4. The apparatus of claim 1, wherein the capacitor comprises:
   a p-substrate;
   an n-well located in the p-substrate;
   an n-type polysilicon gate attached to the n-well and coupled to the node; and
   an n-tap attached to the n-well and coupled to a reference node.

5. The apparatus of claim 1, wherein the noise is caused by cosmic rays.

6. An apparatus comprising:
   a signal node; and
   means for increasing a capacitance of said signal node for enabling the state stored on said node to be unaffected by noise, said means having a capacitance that increases in response to noise.

7. The apparatus of claim 6, wherein said means comprises:
   a pMOS capacitor connected to said node; and
   an nMOS capacitor connected to said node.

8. The apparatus of claim 6 wherein the capacitance increases in response to noise.

9. The apparatus of claim 6, wherein the means comprises:
   a p-substrate;
   an n-well located in the p-substrate;
   an n-type polysilicon gate attached to the n-well; and
   an n-tap attached to the n-well.

10. The apparatus of claim 6, wherein the noise is caused by cosmic rays.

11. An apparatus comprising:
    a explicit capacitor having an adjustable capacitance that changes in response to noise; and
    a signal state stored on said capacitor,
    wherein the adjustable capacitance enables the state to be unaffected by noise, so that the state remains stored unchanged on the capacitor.

12. The apparatus of claim 11, wherein the capacitor comprises:
    a pMOS capacitor; and
    an nMOS capacitor connected to share a common node with said pMOS capacitor.

13. The apparatus of claim 11 wherein the capacitance increases in response to noise.

14. The apparatus of claim 11, wherein the capacitor comprises:
    a p-substrate;
    an n-well located in the p-substrate;
    a n-type polysilicon gate attached to the n-well; and
    an n-tap attached to the n-well.

15. The apparatus of claim 11, wherein the state is '0' represented by approximately zero volts.

16. The apparatus of claim 11, wherein the state is '1' represented by approximately one volt.

17. An apparatus comprising:
    a explicit capacitor having a capacitance that changes in response to noise, said capacitor including
    a pMOS FET device to operate as a first capacitor to store a first charge;
    an nMOS FET device to operate as a second capacitor to store a second charge, the gates of the FETs are connected to a signal node to receive an input signal.

18. The apparatus of claim 17 wherein the capacitance increases in response to noise that tends to change the state of the pMOS and nMOS capacitors.

19. An apparatus comprising:
a explicit capacitor having a capacitance that increases in response to noise, said capacitor including
a p-substrate;
an n-well located in the p-substrate;
an n-type polysilicon gate above the n-well as one plate of the explicit capacitor; and
an n-tap attached to the n-well as another plate of the explicit capacitor.

20. The apparatus of claim 19 further comprising:
an internal resistance to connect the polysilicon gate to the n-tap through the n-well.

21. A method comprising:
applying a signal to a node of an integrated circuit; and
providing, via an on-chip structure, additional capacitance to the node in response to noise that tends to change a state of the signal on the node.

22. The method of claim 21 wherein the signal is at a state at approximately 0 volt and said noise tends to increase the signal voltage towards another state at approximately 1 volt.

23. The method of claim 21 wherein the signal is at a state at approximately 1 volt and the noise tends to decrease the signal voltage towards another state at approximately 0 volt.

24. The method of claim 21 wherein the additional capacitance is provided by an on-chip structure that includes an n-well located in a p-substrate of the integrated circuit, a polysilicon gate formed on the n-well and to which the signal is applied, and an n-tap formed in the n-well and coupled to a reference node of the integrated circuit.

25. The method of claim 21 wherein the additional capacitance is provided by an on-chip structure that includes a pair of complementary MOS transistor capacitors whose gate electrodes receive the signal.

* * * * *